United States Patent [19]

Takahashi

[11] Patent Number: 5,641,982

[45] Date of Patent: Jun. 24, 1997

[54] HIGH VOLTAGE MOSFET WITH AN IMPROVED CHANNEL STOPPER STRUCTURE

[75] Inventor: Mitsuasa Takahashi, Tokyo, Japan

[73] Assignee: NEC Corporation, Tokyo, Japan

[21] Appl. No.: 550,773

[22] Filed: Oct. 31, 1995

[30] Foreign Application Priority Data

Oct. 31, 1994 [JP] Japan .................................. 6-290429

[51] Int. Cl.⁶ ............................ H01L 29/76; H01L 29/94; H01L 31/062; H01L 31/113
[52] U.S. Cl. .......................... 257/398; 257/399; 257/400; 257/652
[58] Field of Search ........................... 257/398, 399, 257/400, 652

[56] References Cited

U.S. PATENT DOCUMENTS

| | | | |
|---|---|---|---|
| 4,454,525 | 6/1984 | Wada et al. | 357/23 |
| 4,590,665 | 5/1986 | Owens et al. | 29/571 |
| 5,192,993 | 3/1993 | Arai et al. | 257/400 |

Primary Examiner—Sara W. Crane
Assistant Examiner—Douglas Wille
Attorney, Agent, or Firm—Young & Thompson

[57] ABSTRACT

The present invention provides a MOS field effect transistor comprising: a semiconductor substrate having a first conductivity type; source/drain regions of a second conductivity type; lightly doped regions covering the bottom of the source/drain regions and surrounding the source/drain regions, the lightly doped regions having the second conductivity type and a lower impurity concentration than an impurity concentration of the source/drain regions; an off-set region surrounding the lightly doped regions, the off-set region having the first conductivity type, the off-set region having a lower impurity concentration than the impurity concentration of the lightly doped regions; and a channel stopper region having the first conductivity type, the channel stopper region having a higher impurity concentration than the impurity concentration of the off-set region, the channel stopper region surrounding the off-set region, the channel stopper region having projected portions under a gate electrode, the projected portions projecting in the inward direction so that inner sides of the projected portions be in contact with the ends of a channel region defined by the lightly doped regions, and that the projected portions be in contact with the lightly doped region.

3 Claims, 4 Drawing Sheets

HIGH VOLTAGE MOSFET WITH AN IMPROVED CHANNEL STOPPER STRUCTURE

BACKGROUND OF THE INVENTION

The present invention relates to a high voltage MOS field effect transistor, and more particularly to a high voltage MOS field effect transistor with a channel stopper region for preventing a leakage current between source and drain regions.

It has been known in the art, to which the invention pertains, to provide a channel stopper region around each of the MOS field effect transistors integrated on a semiconductor substrate doped with an impurity at a low concentration. The channel stopper can provide electrical isolation between the individual MOS field effect transistors. The channel stopper comprises a region doped with an impurity of the same conductivity type as an impurity doped in the semiconductor substrate. Namely, the conductivity type of the impurity of the channel stopper is opposite to the conductivity type of the impurity of the source/drain regions. The channel stopper has a higher impurity concentration than an impurity concentration of the semiconductor substrate. The source/drain regions are designed to have a high impurity concentration to reduce resistivity.

If the channel stopper region is formed to be in contact with the source/drain regions, then a p-n junction of the high impurity concentration is formed at the boundary between the channel stopper region and each of the source/drain regions. If the source/drain regions are biased at a high voltage, for example, 20 V, then the p-n junction is biased in a reverse direction at the high voltage. As a result, it is possible that an avalanche break down appears at the p-n junction, namely at the boundary between the channel stopper region and each of the source/drain regions. The avalanche break down causes a leakage current between the channel stopper region and each of the source/drain regions.

In order to prevent the above leakage current, it has been proposed to provide an off-set region between the channel stopper region and each of the source/drain regions. The off-set region is provided to surround the source/drain diffusion regions. The off-set region has a lower impurity concentration than an impurity concentration of the channel stopper region. The impurity of the off-set region is the same conductivity type as the impurity of the channel stopper region. As a result, the off-set region extends under a gate electrode, on which a gate signal is applied. When the gate signal is applied to the gate electrode, then an inversion layer is formed in the off-set region under the gate electrode. This causes a leakage current to flow between the source/drain diffusion regions through the inversion layer in the off-set region under the gate electrode.

In order to settle this problem, it has been proposed to improve the off-set structure under the gate electrode. This improved off-set structure under the gate electrode is disclosed in Japanese laid-open patent application No. 2-15672. FIG. 1 is a plane view illustrative of the MOS field effect transistor with an improved off-set structure under the gate electrode. FIGS. 2A, 2B and 2C are cross sectional elevation views, along A—A, B—B and C—C lines respectively, illustrative of the MOS field effect transistor with an improved off-set structure under the gate electrode. A substrate 21 comprises an n-type silicon substrate. A p-type well region 22 is formed on the n-type silicon substrate 21. Field oxide films 23 are selectively formed on a top surface of the p-type well region 22 to define an active region on the surface of the p-type well region 22. A gate oxide film 24 is selectively formed on the active region of the p-type well region 22. A gate electrode 25 is formed on the gate oxide film 24. Source/drain regions 27-1 and 27-2 of n-type conductivity are formed by implanting an n-type impurity into the surface region of the p-type well region, where the gate electrode 25 and the gate oxide film 24 are used as masks. The n-type source/drain regions 27-1 and 27-2 have a high impurity concentration. In the plane view, a p-type channel stopper region 28 is formed around the active region on which the n-type source/drain regions 27-1 and 27-2 are formed. In the cross sectional elevation view, the p-type channel stopper region 28 is positioned under the field oxide film 23.

At a drain side where the n-type drain region 27-2 is formed, the p-type channel stopper region 28 is provided to surround the off-set region 29 which surrounds the drain region 27-2. The edge of the channel stopper 28 is positioned outside the edge of the field oxide film 23. The drain region 27-2 is applied with a high voltage, for example, 20 V. The off-set region 29 has a low concentration of the p-type impurity. For that reason, it is impossible that the avalanche break down appears at the p-n junction between the drain region 27-2 having a high concentration of the n-type impurity and the off-set region 29 having a low concentration of the p-type impurity. On the other hand, at a source side where the n-type source region 27-1 is formed, there is formed no off-set region. For that reason, the p-type channel stopper region 28 is provided to directly surround the source region 27-1. The edge of the channel stopper 28 is positioned to correspond to the edge of the field oxide film 23. The off-set region 29 beside the drain side is terminated under the gate electrode 25 at an intermediate position where a boundary between the source side and the drain side is positioned. At the source side of the boundary between the source and drain sides, the inner edge of the channel stopper region corresponds to the outer edge of the source region 27-1. At the drain side of the boundary between the source and drain sides, the inner edge of the channel stopper region extends to be in contact with the outer edge of the drain region 27-2. The above structure allows a high voltage of 20 V to be applied to the drain region 27-2, and the source region to be grounded, so that the source and drain regions are biased with a high voltage.

The above structure has a problem as described below. Under the gate electrode at the drain side of the boundary, the off-set region 28 resides. At this position, it is possible that the leakage current appears. In the above structure, there still remains the problem with the leakage current.

According to the above structure, the drain region 27-2 resides in the vicinity of the gate electrode 25. If the drain region 27-2 is applied with a high voltage such as 20 V, an excess high electric field is generated between the gate electrode 25 and the drain region 27-2. To operate this transistor under the high bias voltage such as 20 V, it is necessary to relax the excess high electric field. For this purpose, it is possible to further provide a lightly doped region surrounding the drain region 27-2 wherein the lightly doped region has a lower impurity concentration than the impurity concentration of the drain region. The lightly doped region has the same conductivity type as the drain region. Providing the lightly doped region along its side abutting the channel region makes the drain region 27-2 apart from the gate electrode. A distance between the drain region 27-2 and the gate electrode 25 is enlarged. As a result, the intensity of the electric field between the drain region 27-2 and the gate electrode 25 is reduced, while the level of the voltage applied between those. This structure simultaneously causes another problem with increase in the ON-resistance of the transistor.

When the transistor turns ON, the current flows between the source/drain regions via the channel region. If the lightly doped region is provided along its side abutting of the channel region, the current flows via the lightly doped region. As described above, the lightly doped region has a low impurity concentration. Thus, the lightly doped region has a higher resistivity than the resistivity of the source/drain regions. As a result, the effective ON-resistance between the source and drain regions is increased by providing the lightly doped region.

Under the above circumstances, it has been sought to develop a novel structure of the channel stopper under the gate electrode for the high voltage MOS field effect transistor.

SUMMARY OF THE INVENTION

Accordingly, it is an object of the present invention to provide a novel MOS field effect transistor with an improved channel stopper structure under a gate electrode.

It is an object of the present invention to provide a novel high voltage MOS field effect transistor with an improved channel stopper structure suitable for suppressing a leakage current between source and drain regions.

The above and other objects, features and advantages of the present invention will be apparent from the following descriptions.

The present invention provides a MOS field effect transistor comprising: a semiconductor substrate having a first conductivity type; source/drain regions of a second conductivity type; lightly doped regions covering the bottom of the source/drain regions and surrounding the source/drain regions, the lightly doped regions having the second conductivity type and a lower impurity concentration than an impurity concentration of the source/drain regions; an off-set region surrounding the lightly doped regions, the off-set region having the first conductivity type, the off-set region having a lower impurity concentration than the impurity concentration of the lightly doped regions; and a channel stopper region having the first conductivity type, the channel stopper region having a higher impurity concentration than the impurity concentration of the off-set region, the channel stopper region surrounding the off-set region, the channel stopper region having projected portions under a gate electrode, the projected portions projecting in the inward direction so that inner sides of the projected portions be in contact with the ends of a channel region defined by the lightly doped regions, and that the projected portions be in contact with the lightly doped region.

The present invention also provides a MOS field effect transistor comprising: a semiconductor substrate; a well region having a first conductivity type and being formed on the substrate; source/drain regions of a second conductivity type; lightly doped regions covering the bottom of the source/drain regions and surrounding the source/drain regions, the lightly doped regions having the second conductivity type and a lower impurity concentration than an impurity concentration of the source/drain regions; an off-set region surrounding the lightly doped regions, the off-set region having the first conductivity type, the off-set region having a lower impurity concentration than the impurity concentration of the lightly doped regions; and a channel stopper region having the first conductivity type, the channel stopper region having a higher impurity concentration than the impurity concentration of the off-set region, the channel stopper region surrounding the off-set region, the channel stopper region having projected portions under a gate electrode, the projected portions projecting in the inward direction so that inner sides of the projected portions be in contact with the ends of a channel region defined by the lightly doped regions, and that the projected portions be in contact with the lightly doped region.

BRIEF DESCRIPTIONS OF THE DRAWINGS

Preferred embodiments of the present invention will be described in detail with reference to the accompanying drawings.

PREFERRED EMBODIMENTS OF THE PRESENT INVENTION

Figure 1:
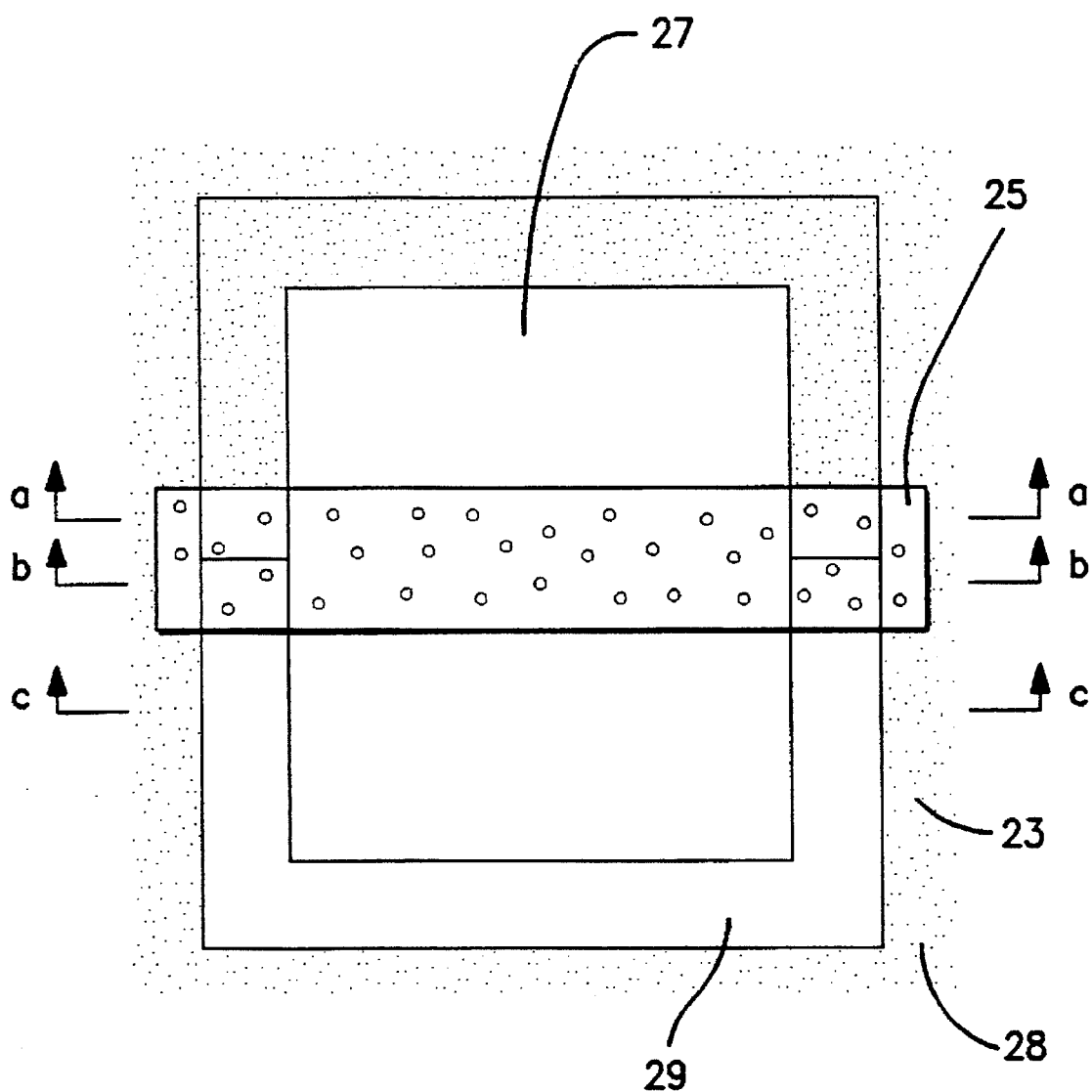
FIG. 1 is a plane view illustrative of the conventional high voltage MOS field effect transistor.
Figure 2A:
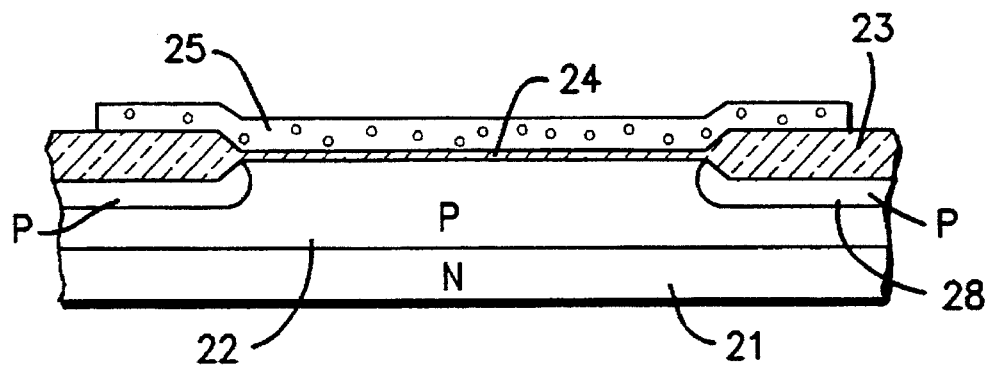
FIG. 2A is a cross sectional elevation view, along an A—A line of FIG. 1, illustrative of the conventional high voltage MOS field effect transistor.
Figure 2B:
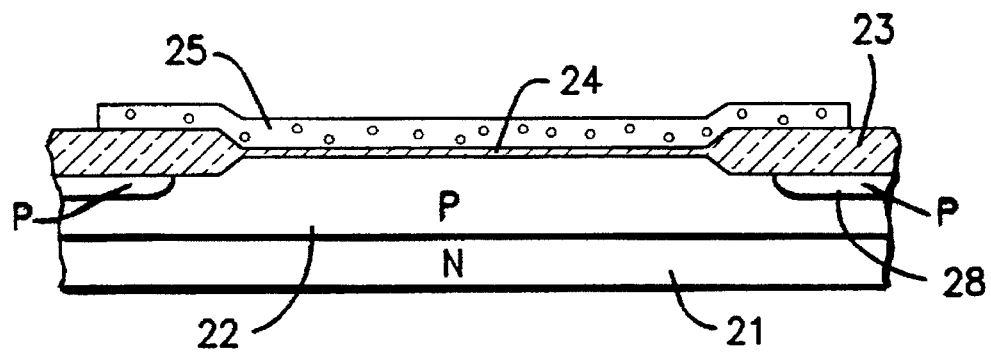
FIG. 2B is a cross sectional elevation view, along a B—B line of FIG. 1, illustrative of the conventional high voltage MOS field effect transistor.
Figure 2C:
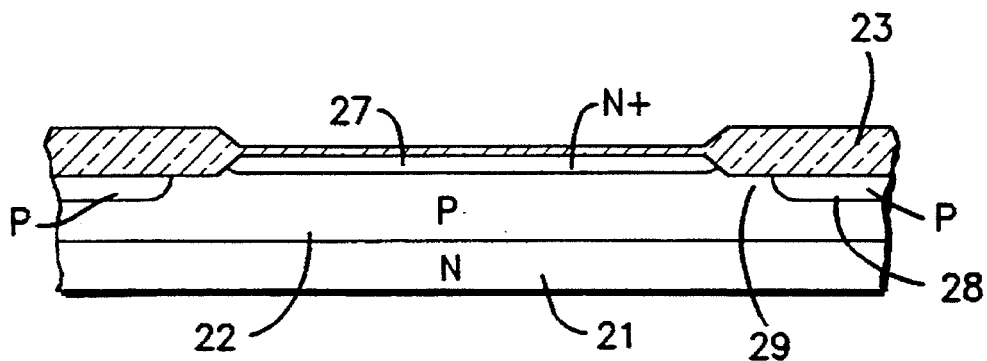
FIG. 2C is a cross sectional elevation view, along a C—C line of FIG. 1, illustrative of the conventional high voltage MOS field effect transistor.
Figure 3:
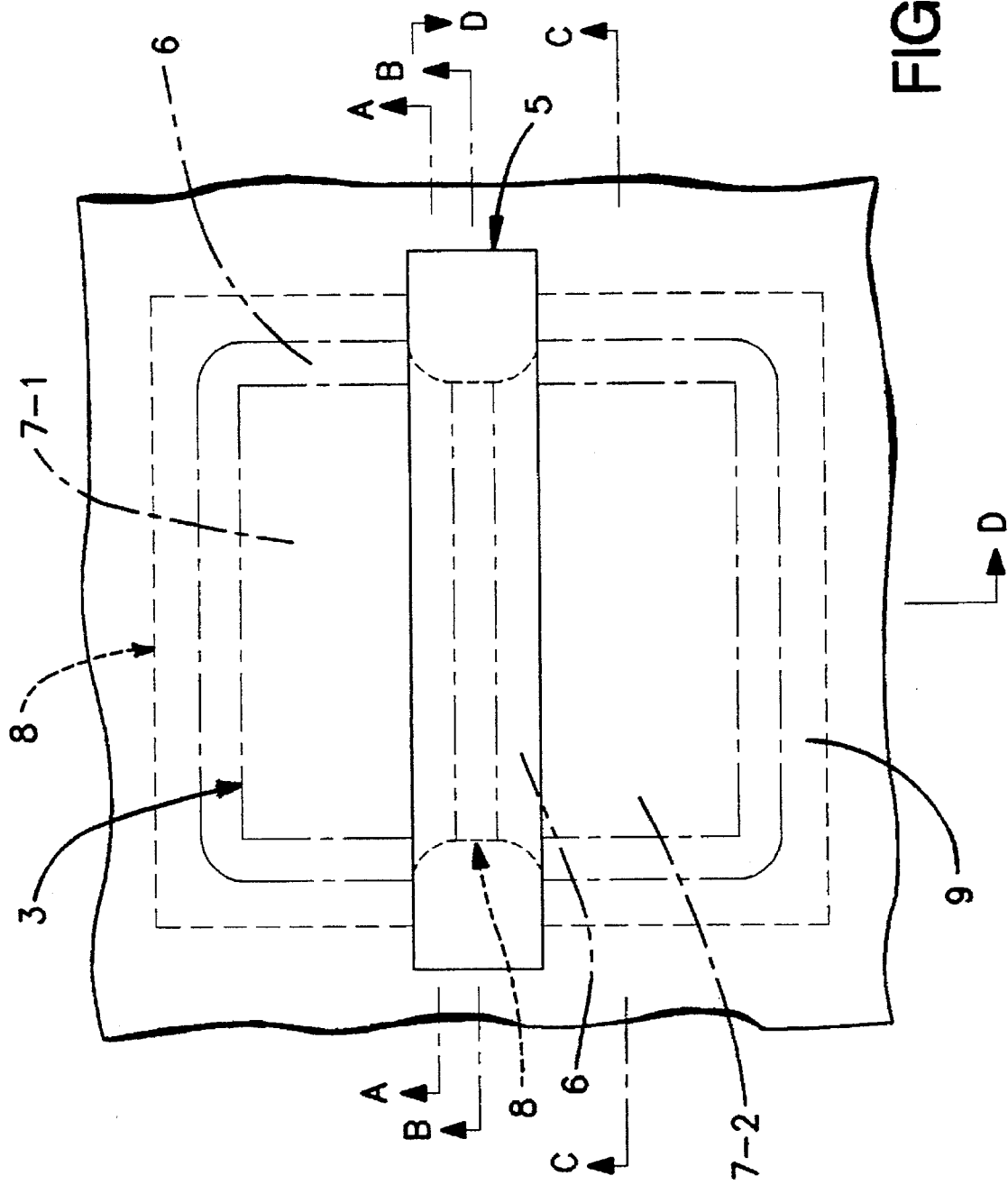
FIG. 3 is a plane view illustrative of a novel high voltage MOS field effect transistor with an improved channel stopper structure under a gate electrode according to the present invention.
Figure 4A:
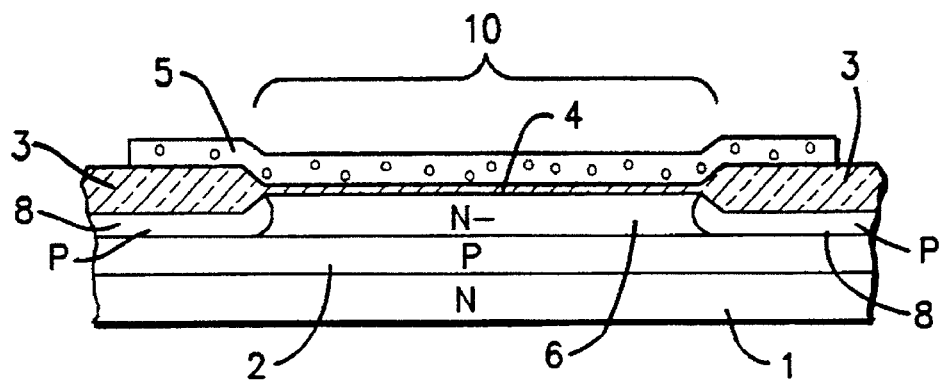
FIG. 4A is a cross sectional elevation view, along an A—A line of FIG. 3, illustrative of a novel high voltage MOS field effect transistor according to the present invention.
Figure 4B:
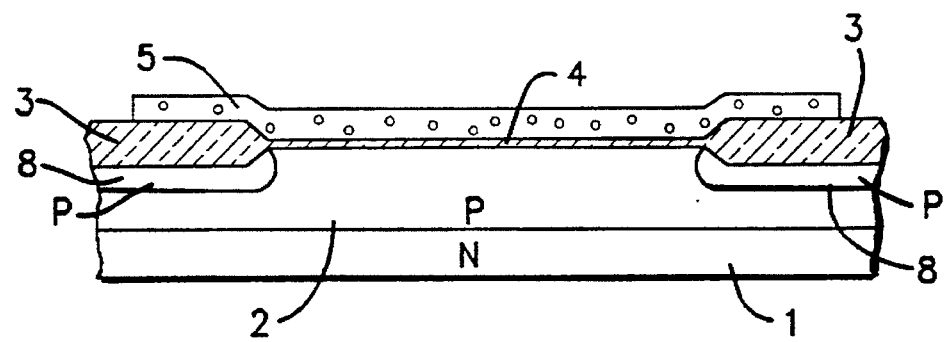
FIG. 4B is a cross sectional elevation view, along a B—B line of FIG. 3, illustrative of a novel high voltage MOS field effect transistor. according to the present invention
Figure 4C:
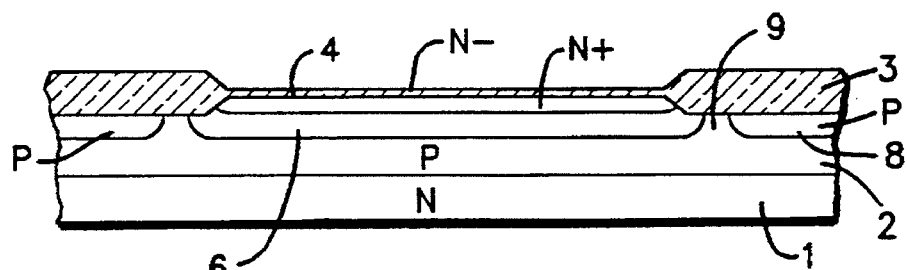
FIG. 4C is a cross sectional elevation view, along a C—C line of FIG. 3, illustrative of a novel high voltage MOS field effect transistor according to the present invention.
Figure 4D:
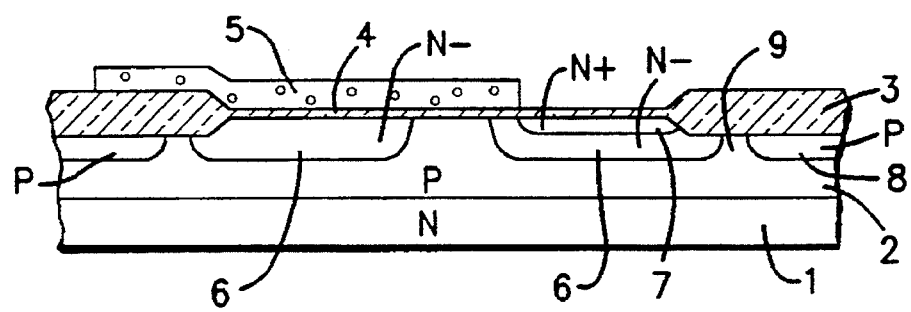
FIG. 4D is a cross sectional elevation view, along a D—D line of FIG. 3, illustrative of a novel high voltage MOS field effect transistor according to the present invention.

A first embodiment according to the present invention will be described with reference to FIGS. 3, 4A, 4B, 4C and 4D. A substrate 1 comprises an n-type silicon substrate doped with boron at a doping concentration of $1E15/cm^3$. A p-type well region 2 having a doping concentration of $3E16/cm^3$ is formed in an upper region of the n-type silicon substrate 1. The p-type well region 2 has a depth of 10 micrometers. A field oxide film 3 is selectively formed on a surface of the p-type well region 2. In FIG. 3, the field oxide film 3 extends outside an inner rectangular-shaped line marked by an arrow labeled with "3". An active region is defined inside the inner rectangular-shaped line marked by an arrow labeled with "3". On the active region, the p-type well region 2 is exposed. The field oxide film 3 has a thickness of 1.2 micrometers. A gate oxide film 4 is selectively formed on the exposed surface of the p-type well region 2. The gate oxide film 4 has a stripe shape and extends in a horizontal direction in FIG. 3 to divide the exposed surface of the p-type well region 2 into two parts. The gate oxide film 4 has a thickness of about 0.05 micrometers and a width of about 5 micrometers. A gate electrode 5 is formed on the gate oxide film 4.

The gate electrode 5 comprises a polysilicon film doped with phosphorus at a doping concentration of $5E19/cm^3$.

Further, n-type low impurity concentration regions 6 are selectively formed in the exposed surfaces of the p-type well region 2 by a selective ion implantation method. Arsenic or phosphorus is selectively doped at a doping concentration of $5E16/cm^3$ into the exposed surfaces of the p-type well region 2 by using the field oxide film 3, the gate oxide film 4 and the gate electrode 5 as masks. The n-type low impurity concentration regions 6 extend inside an intermediate rectangular-shaped line adjacent to and outside the inner rectangular-shaped line. The n-type low impurity concentration regions 6 have a depth of about 3 micrometers and a doping concentration of $5E16/cm^3$. Furthermore, n-type high impurity concentration regions 7 are selectively formed in the n-type low impurity concentration regions 6 by a selective ion implantation. Arsenic or phosphorus is selectively doped at a doping concentration of $1E20/cm^3$ into the n-type low impurity concentration regions 6 by using the field oxide film 2, the gate oxide film 4 and the gate electrode 5 as masks. The n-type high impurity concentration regions 7 extend inside the inner rectangular-shaped line adjacent to and inside the intermediate rectangular-shaped line. The n-type high impurity concentration regions 7 have a depth of about 0.3 micrometers and a doping concentration of $1E20/cm^3$. The n-type low impurity concentration regions 6 extend to cover the bottom of the n-type high impurity concentration regions 7 and surround the surface of the n-type high impurity concentration regions 7. The top portion of the n-type low impurity concentration regions 6 resides around the four sides of each of the n-type high impurity concentration regions 7 under the gate electrode 5. As a result, an inner part of the top port/on of each of the n-type low impurity concentration regions 6 resides under the gate electrode 5. A channel region is defined between the inner parts of the top portions of the n-type low impurity concentration regions 6. In the channel region, the p-type well region is exposed to the gate oxide film 4. In FIG. 3, the channel region corresponds to a belt-like area positioned at an intermediate position within the gate electrode region.

Under the field oxide film 3, a p-type channel stopper region 8 is formed. The p-type channel stopper region 8 has a doping concentration of $3E17/cm^3$, which is higher than the doping concentration of the p-type well region 2. The p-type channel stopper region 8 has a depth of 2 micrometers. In FIG. 3, the p-type channel stopper region 8 extends outside an outer rectangular-shaped line made by an arrow labeled with "8". Inside edges of the p-type channel stopper region 8 are separated by an off-set region 9 from the outside edges of the n-type low impurity concentration region 6. In the off-set region 9, the p-type well region 2 is exposed to the bottom of the field oxide film 3. Under the gate oxide electrode 5, the p-type channel stopper region 8 have projected portions which project in the inward directions. Each of the projected portions of the p-type channel stopper regions 8 extends from the outer line to the inner line so that an inner side of the each projected portion is in contact with an end of the channel region. Also, corners of the each projected portion are in contact with the n-type low impurity concentration region 6. Straight sides of the each projected portion are in contact with the ends of the off-set regions. The projected portions of the p-type channel stopper regions 8 extend so that there is formed no off-set region 9 under the gate electrode 5. The projected portions extend so as to separate the top portions of the n-type low impurity concentration regions 6 from each other, wherein the top portions surround the source/drain regions respectively.

The off-set region 9 separates the p-type channel stopper region 8 having the high impurity concentration from the n-type high impurity concentration regions 7. As a result, a p-n junction is formed at the boundary between the n-type low impurity concentration region 6 and the p-type well region 2 having the low impurity concentration. The impurity concentration of the p-n junction is relatively low. Thus, there appears no avalanche break down phenomenon at such the p-n junction even when the high bias voltage, for example, 20 V is applied onto the drain region. Accordingly, no leakage current due to the avalanche break down phenomenon flows between the source and drain regions.

The projected portions of the p-type channel stopper 8 terminates the off-set region 9 outside a region, over which the gate electrode 5 is formed. On the off-set region 9, the p-type well region 2 resides. However, the p-type well region 2 having the low impurity concentration does not reside under the gate electrode 5. Under the gate electrode 5, the projected portion of the p-type channel stopper region 8 having the high impurity concentration region reside, in place of the p-type well region 2. The high impurity concentration of the p-type channel stopper region 8 makes it difficult to cause an inversion region, through which a leakage current flows between the source and drain regions 7. Thus, the projected portion of the p-type channel stopper region 8 can prevent any leakage current between the source and drain regions 7.

Under the gate electrode 5, the projected portions of the p-type channel stopper region 8 are in contact with the n-type low impurity concentration regions 6, but separated from the n-type high impurity concentration regions 7. As a result, a p-n junction is formed at the boundary between the n-type low impurity concentration region 6 and the projected portions of the p-type channel stopper region 8. The impurity concentration of the p-n junction is relatively low. Thus, there appears no avalanche break down phenomenon at such the p-n junction even when the high bias voltage, for example, 20 V is applied onto the drain region. Accordingly, no leakage current due to the avalanche break down phenomenon flows between the source and drain regions.

The drain region of the n-type high impurity concentration region 7 is surrounded by the n-type low impurity concentration diffusion region 6. As a result, the drain region is spaced apart from the gate electrode 5. Thus, it is possible to apply a high bias voltage over 20 V to the drain region. It is also possible to suppress the leakage current within about 10 micrometers. By changing the impurity concentration and the size of the n-type low impurity concentration diffusion region 6, it is possible to change the level of the voltage applicable to the drain.

As modifications of the present invention, it is available that at least any one of the source and drain regions is surrounded by the low impurity concentration region. In this case, the projected portions of the channel stopper region has to be formed in contact with the low impurity concentration region, but separated from the high impurity concentration region.

Whereas modifications of the present invention will be apparent to a person having ordinary skill in the art, to which the invention pertains, it is to be understood that embodiments shown and described by way of illustrations are by no means intended to be a limiting sense. Accordingly, it is to be intended to cover by claims all modifications which fall within the spirit and scope of the present invention.

What is claimed is:

1. A MOS field effect transistor comprising:

a semiconductor substrate having a first conductivity type;

source/drain regions of said first conductivity type;

lightly doped regions covering a bottom of said source/drain regions and extending to sides of said source/drain regions, said lightly doped regions having the first conductivity type and having a lower impurity concentration than an impurity concentration of said source/drain regions;

an off-set region extending to said lightly doped regions, said off-set region having a second conductivity type, said off-set region having a lower impurity concentration than the impurity concentration of said lightly doped regions; and a channel stopper region having the second conductivity type, said channel stopper region having a higher impurity concentration than the impurity concentration of said off-set region, said channel stopper region extending to said off-set region, said channel stopper region having projected portions under a gate electrode, said projected portions projecting inwardly so that inner sides of said projected portions are in contact with the ends of a channel region defined by said lightly doped regions, and so that said projected portions are in contact with said lightly doped region.

2. A MOS field effect transistor comprising:

a semiconductor substrate;

a well region having a first conductivity type and being formed on said substrate;

source/drain regions of a second conductivity type;

lightly doped regions covering a bottom of said source/drain regions and extending to sides of said source/drain regions, said lightly doped regions having the second conductivity type and having a lower impurity concentration than an impurity concentration of said source/drain regions;

an off-set region extending to said lightly doped regions, said off-set region having the first conductivity type, said off-set region having a lower impurity concentration than the impurity concentration of said lightly doped regions; and a channel stopper region having the first conductivity type, said channel stopper region having a higher impurity concentration than the impurity concentration of said off-set region, said channel stopper region extending to said off-set region, said channel stopper region having projected portions under a gate electrode, said projected portions projecting inwardly so that inner sides of said projected portions are in contact with the ends of a channel region defined by said lightly doped regions, and so that said projected portions are in contact with said lightly doped region.

3. A MOS field effect transistor comprising:

a semiconductor substrate of a first conductivity;

a well layer of a second conductivity formed on said substrate;

a peripheral channel stopper region of said second conductivity formed on said well layer and delimiting a device area of said transistor;

first and second lightly doped regions of said first conductivity formed on said well layer within said device area, and separated from said channel stopper region by a raised peripheral offset region of said well layer and from each other by a raised central offset region of said well layer;

source and drain regions of said first conductivity formed respectively on said first and second lightly doped regions, said source and drain regions being separated from said peripheral and central raised portions of said well layer by peripheral raised portions of said first and second lightly doped regions; and a gate electrode overlying said raised central offset region of said well layer, wherein said channel stopper region comprises portions projecting inwardly of said device area beneath said gate electrode and contacting said first and second lightly doped regions.

* * * * *